United States Patent
Lee et al.

(10) Patent No.: US 11,804,865 B2
(45) Date of Patent: Oct. 31, 2023

(54) ANTENNA TUNER

(71) Applicant: Qualcomm Incorporated, San Diego, CA (US)

(72) Inventors: Hong-Ming Lee, San Diego, CA (US); Darryl Sheldon Jessie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 60 days.

(21) Appl. No.: 17/322,294

(22) Filed: May 17, 2021

(65) Prior Publication Data

US 2022/0368359 A1    Nov. 17, 2022

(51) Int. Cl.
*H04B 1/04* (2006.01)
*H04B 1/16* (2006.01)
*H01Q 23/00* (2006.01)
*H04B 1/10* (2006.01)

(52) U.S. Cl.
CPC ........... *H04B 1/0458* (2013.01); *H01Q 23/00* (2013.01); *H04B 1/1036* (2013.01); *H04B 1/1607* (2013.01); *H04B 2001/0408* (2013.01)

(58) Field of Classification Search
CPC ...... H04B 1/0458; H04B 1/1036; H04B 1/10; H04B 1/12; H04B 1/123; H04B 1/1607; H04B 1/38; H04B 1/40; H04B 1/44; H01Q 23/00; H03H 1/00; H03H 1/0007; H03H 1/02; H03H 2001/0021; H03H 2001/0092; H03H 2210/025; H03H 2210/026; H03H 2210/03; H03H 2210/033; H03H 2210/036

See application file for complete search history.

(56) References Cited

U.S. PATENT DOCUMENTS

| | | | |
|---|---|---|---|
| 6,441,790 B1 * | 8/2002 | Forrester ................. | H01Q 1/38 343/700 MS |
| 8,270,921 B2 * | 9/2012 | Dubash ................... | H04B 1/40 455/193.1 |
| 8,350,763 B2 * | 1/2013 | Rappaport ........... | H04B 1/0053 343/702 |
| 8,706,272 B2 * | 4/2014 | Lindahl ................. | G10L 19/20 369/7 |
| 9,960,791 B2 * | 5/2018 | Desclos ............... | H04B 1/0057 |
| 10,348,346 B2 * | 7/2019 | Ramasamy ............. | H04B 1/18 |

(Continued)

FOREIGN PATENT DOCUMENTS

EP    3016200 A1    5/2016

OTHER PUBLICATIONS

International Search Report and Written Opinion—PCT/US2022/071846—ISA/EPO—dated Aug. 25, 2022, 12 pages.

*Primary Examiner* — Quochien B Vuong
(74) *Attorney, Agent, or Firm* — Colby Nipper/Qualcomm Incorporated

(57) ABSTRACT

An apparatus is disclosed for implementing an antenna tuner. In an example aspect, the apparatus includes a substrate, an antenna disposed on or in the substrate, a radio-frequency integrated circuit disposed on the substrate, and an antenna tuner. The radio-frequency integrated circuit includes an amplification circuit. The antenna tuner is coupled between the antenna and the amplification circuit. The antenna tuner includes an inductive component disposed on or in the substrate and a capacitive component implemented within the radio-frequency integrated circuit.

30 Claims, 10 Drawing Sheets

(56) References Cited

U.S. PATENT DOCUMENTS

| | | | |
|---|---|---|---|
| 10,812,199 B1* | 10/2020 | Kerselaers | H04B 5/02 |
| 10,980,035 B2* | 4/2021 | Ioffe | H04W 72/21 |
| 2013/0063223 A1 | 3/2013 | See et al. | |
| 2018/0205413 A1 | 7/2018 | Patel et al. | |

* cited by examiner

600

Provide, via an antenna tuner, an impedance between an amplification circuit of a radio-frequency integrated circuit and an antenna disposed on or in a substrate, the impedance based on a positive reactance of an inductive component of the antenna tuner and a negative reactance of a capacitive component of the antenna tuner, the inductive component disposed on or in the substrate, the capacitive component implemented within the radio-frequency integrated circuit, the radio-frequency integrated circuit disposed on the substrate
602

Pass, via the antenna tuner having the impedance, a radio-frequency signal from the amplification circuit to the antenna
604

Transmit, via the antenna, the radio-frequency signal
606

```
┌─────────────────────────────────────┐
│   Receive, via an antenna disposed on or │
│   in a substrate, a radio-frequency signal │
│                  702                │
└─────────────────────────────────────┘
                  │
                  ▼
┌─────────────────────────────────────┐
│ Provide, via an antenna tuner, an impedance between │
│ an amplification circuit of a radio-frequency integrated │
│ circuit and the antenna, the impedance based on a positive │
│ reactance of an inductive component of the antenna tuner │
│ and a negative reactance of a capacitive component of │
│ the antenna tuner, the inductive component disposed on or │
│ in the substrate, the capacitive component implemented │
│ within the radio-frequency integrated circuit, the radio- │
│ frequency integrated circuit disposed on or in the substrate │
│                  704                │
└─────────────────────────────────────┘
                  │
                  ▼
┌─────────────────────────────────────┐
│   Pass, via the antenna tuner having the │
│   impedance, the radio-frequency signal from │
│   the antenna to the amplification circuit │
│                  706                │
└─────────────────────────────────────┘
```

FIG. 7

ANTENNA TUNER

TECHNICAL FIELD

This disclosure relates generally to wireless communications and, more specifically, to an antenna tuner for a wireless device.

BACKGROUND

An electronic device may use a radio-frequency integrated circuit and an antenna to transmit or receive wireless communication signals. The radio-frequency integrated circuit and the antenna can be designed to have matching impedances that enable power to be efficiently transferred between the radio-frequency integrated circuit and the antenna without significant losses. Maintaining matched impedances, however, can be difficult during operation, and some power may be reflected as a result. This reflected power can reduce transmission signal strength or reception sensitivity of the electronic device, thereby making it challenging for the electronic device to communicate with other entities across farther distances.

SUMMARY

An apparatus is disclosed that implements an antenna tuner. Instead of implementing a discrete antenna tuner on a substrate and coupling the discrete antenna tuner between an antenna and a radio-frequency integrated circuit, components of the described antenna tuner are distributed between the substrate and the radio-frequency integrated circuit of a module. In particular, the antenna tuner can include at least one inductive component disposed on the substrate and at least one capacitive component integrated within the radio-frequency integrated circuit, which are all packaged into a module. With this architecture, the antenna tuner can have a space-saving design that can satisfy a size constraint of a given electronic device. This architecture also enables the integration of multiple antenna tuners within the electronic device (e.g., within a single antenna module) to dynamically tune impedances associated with individual antenna elements of an antenna array.

In an example aspect, an apparatus is disclosed. The apparatus includes a substrate, an antenna disposed on or in the substrate, a radio-frequency integrated circuit disposed on the substrate, and an antenna tuner. The radio-frequency integrated circuit includes an amplification circuit. The antenna tuner is coupled between the antenna and the amplification circuit. The antenna tuner includes an inductive component disposed on the substrate and a capacitive component implemented within the radio-frequency integrated circuit.

In an example aspect, an apparatus is disclosed. The apparatus includes a substrate and antenna means for transmitting and receiving radio-frequency signals. The antenna means is disposed on or in the substrate. The apparatus also includes an integrated circuit including means for conditioning radio-frequency signals. The integrated circuit is disposed on the substrate. The apparatus additionally includes tuning means for providing impedance matching between the antenna means and the means for conditioning. The tuning means includes inductive means for providing a positive reactance and capacitive means for providing a negative reactance. The inductive means is disposed on or in the substrate and the capacitive means is implemented as part of the integrated circuit.

In an example aspect, a method for operating an antenna tuner is disclosed. The method includes providing, via the antenna tuner, an impedance between an amplification circuit of a radio-frequency integrated circuit and an antenna disposed on or in a substrate. The impedance is based on a positive reactance of an inductive component of the antenna tuner and a negative reactance of a capacitive component of the antenna tuner. The inductive component is disposed on the substrate, and the capacitive component is implemented within the radio-frequency integrated circuit. The radio-frequency integrated circuit is disposed on the substrate. The method also includes passing, via the antenna tuner having the impedance, a radio-frequency signal from the amplification circuit to the antenna. The method additionally includes transmitting, via the antenna, the first radio-frequency signal.

BRIEF DESCRIPTION OF DRAWINGS

FIG. 4-1 illustrates an example sequence flow diagram for adjusting an impedance of an antenna tuner.

FIG. 4-2 illustrates another example sequence flow diagram for adjusting an impedance of an antenna tuner.

FIG. 5-1 illustrates an example implementation of an antenna tuner.

FIG. 5-2 illustrates another example implementation of an antenna tuner.

FIG. 5-3 illustrates an additional example implementation of an antenna tuner.

FIG. 6 is a flow diagram illustrating an example process for operating an antenna tuner.

FIG. 7 is another flow diagram illustrating another example process for operating an antenna tuner.

DETAILED DESCRIPTION

Figure 1:
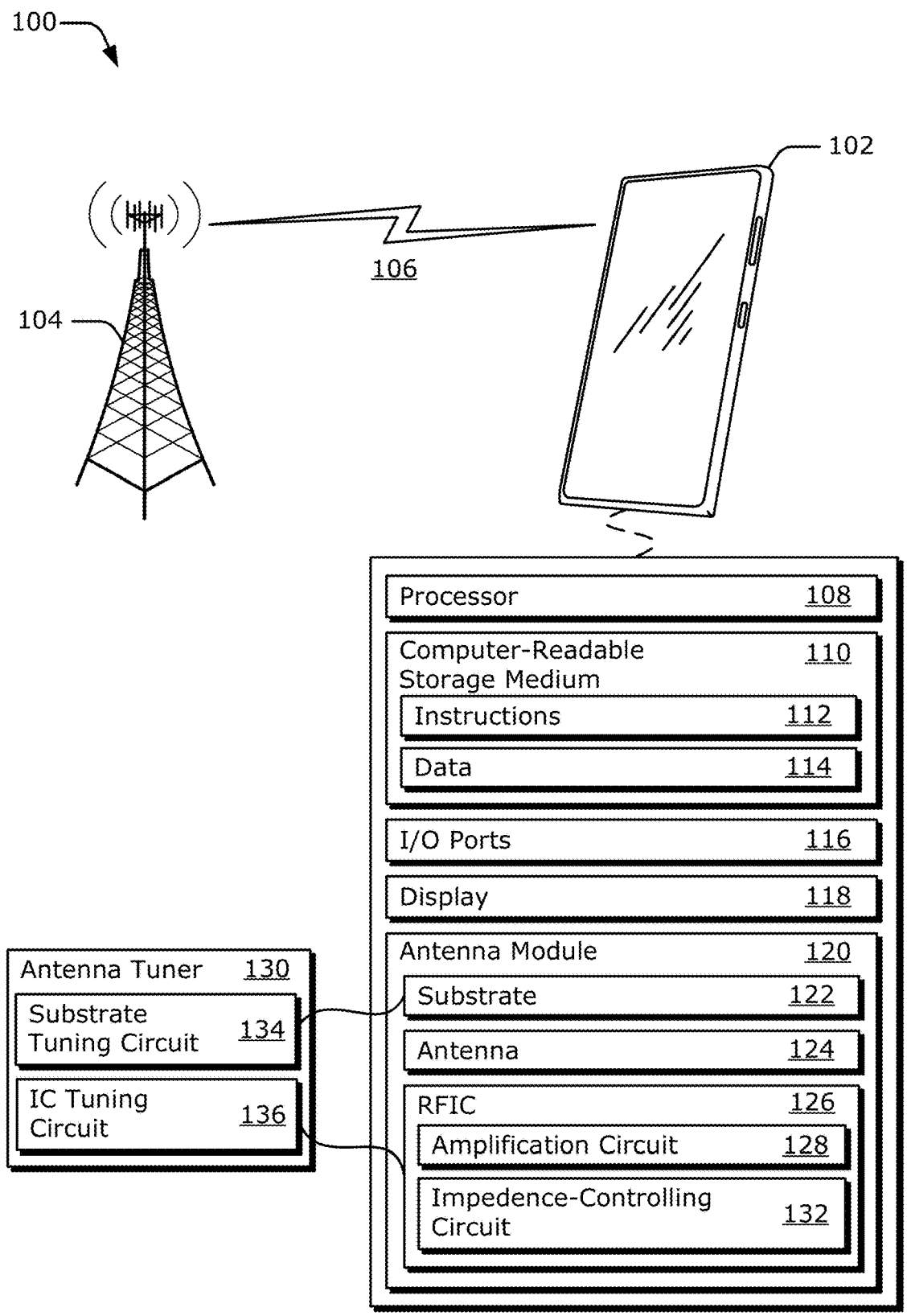
FIG. 1 illustrates an example operating environment for a device including an antenna tuner.

An electronic device may use a radio-frequency integrated circuit and an antenna to transmit or receive wireless communication signals. The radio-frequency integrated circuit and the antenna can be designed to have matching impedances that enable power to be efficiently transferred between the radio-frequency integrated circuit and the antenna without significant losses. The impedance of the antenna, however, can vary due to changes in operational or environmental conditions. Consequently, the impedances of the radio-frequency integrated circuit and the antenna can become mismatched and some power may be reflected. This reflected power can reduce transmission signal strength or reception sensitivity of the electronic device, thereby making it challenging for the electronic device to communicate with other entities across farther distances.

Some techniques may directly connect an antenna tuner between each antenna of the electronic device and the radio-frequency integrated circuit. Although each antenna tuner can be used to adjust an impedance of the corresponding antenna, some antenna tuner architectures are bulky and require a significant amount of space. Consequently, it can be challenging to equip an antenna array with multiple antenna tuners while satisfying a size constraint of a given electronic device, especially for portable electronic devices like smartphones or wearable devices.

To address such challenges, techniques for an antenna tuner are described herein. The described techniques implement an antenna module with a compact design that packages together at least one antenna and at least one radio-frequency integrated circuit (RFIC) on a substrate. The antenna module also includes at least one antenna tuner, which acts as an impedance-matching circuit. The antenna tuner is coupled between the antenna and an amplification circuit of the radio-frequency integrated circuit. The antenna tuner has a variable impedance, which can be adjusted to match an input (or output) impedance of the antenna to an output (or input) impedance of the amplification circuit. By varying the impedance of the antenna tuner, the antenna tuner can maintain similar impedance matching performance across different beamforming operations (e.g., across signals with different phases), different frequency bands (e.g., across signals with different frequencies), and different distances between a user and the antenna.

Instead of implementing a discrete antenna tuner on a substrate and coupling the discrete antenna tuner between the antenna and the radio-frequency integrated circuit, components of the antenna tuner are distributed between the radio-frequency integrated circuit and a substrate of a module in which the radio-frequency integrated circuit is implemented. In particular, the antenna tuner can include at least one inductive component disposed on the substrate and coupled to the antenna and the radio-frequency integrated circuit. The antenna tuner can also include at least one capacitive component integrated within the radio-frequency integrated circuit and coupled to the inductive component and the amplification circuit of the radio-frequency integrated circuit. With this architecture, the antenna tuner can have a space-saving design that enables the antenna module to satisfy a size constraint of the electronic device. This architecture also enables the integration of multiple antenna tuners within the antenna module to dynamically tune impedances associated with individual antenna elements of an antenna array.

FIG. 1 illustrates an example environment 100 for operating a device including an antenna tuner. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, a fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 may wirelessly provide power and the base station 104 may comprise a power source.

As shown, the computing device 102 includes a processor 108 and a computer-readable storage medium 110 (CRM 110). The processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

An antenna module 120 of the computing device 102 provides connectivity to respective networks and other electronic devices connected therewith. The antenna module 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the antenna module 120 enables the computing device 102 to communicate with the base station 104 and networks connected therewith. However, the antenna module 120 can also enable the computing device 102 to communicate "directly" with other devices or networks.

The antenna module 120 includes circuitry and logic for transmitting and receiving communication signals. In particular, the antenna module 120 as shown includes a substrate 122 (e.g., one or more substrate layers), at least one antenna 124, and at least one radio-frequency integrated circuit 126 (RFIC 126) (e.g., a radio-frequency front-end integrated circuit (RFFE IC)). The antenna 124 and the radio-frequency integrated circuit 126 can be packaged together as part of the antenna module 120 and disposed on the substrate 122.

The antenna 124 can include a patch antenna, a cross-patch antenna element (e.g., a patch antenna in the shape of a cross), a slot antenna element, a dipole antenna, a bowtie antenna, an inverted-F antenna, another type of microstrip antenna, or another type of wire antenna. The antenna 124 can be horizontally polarized, vertically polarized, circularly polarized, or some combination thereof. In some implementations, the antenna module 120 includes an antenna array with multiple antennas 124 operating as antenna elements of the antenna array.

The radio-frequency integrated circuit 126 includes circuitry and logic for conditioning signals (e.g., generating and/or processing signals) that are transmitted and received via the antenna 124. Components of the radio-frequency integrated circuit 126 can include amplifiers, phase shifters, switches, mixers, filters, and so forth. In particular, the radio-frequency integrated circuit 126 includes at least one amplification circuit 128. The amplification circuit 128 includes one or more amplifiers, such as a power amplifier (PA) or a low-noise amplifier (LNA). In some cases, the components of the radio-frequency integrated circuit 126 are implemented as separate transmitter and receiver entities. Additionally or alternatively, the radio-frequency integrated circuit 126 can be realized using multiple or different sections to implement respective transmitting and receiving operations (e.g., separate transmit and receive chains).

The radio-frequency integrated circuit 126 can form part of a wireless transceiver (not shown). The wireless transceiver can include other integrated circuits and/or processors. Although not shown, the radio-frequency integrated circuit 126 can be connected to another integrated circuit within the wireless transceiver, such as an intermediate-frequency integrated circuit or a baseband integrated circuit. The radio-frequency integrated circuit 126 can also be connected (indirectly or directly) to a processor, such as the processor 108, another processor, or a modem of the wireless transceiver.

In some implementations, the antenna 124 and the radio-frequency integrated circuit 126 are jointly configured to transmit and receive radio-frequency signals having one or more frequencies within a millimeter-wave (mmW) frequency band, which includes frequencies that are greater than or equal to 24 gigahertz (GHz). Example mmW frequency bands include mmW frequency bands for 5G standards, such as a low mmW frequency band (e.g., a frequency band that includes at least a subset of frequencies between approximately 24 to 35 GHz), a middle mmW frequency band (e.g., a frequency band that includes at least a subset of frequencies between approximately 35 to 50 GHz), or a high mmW frequency band (e.g., a frequency band that includes at least a subset of frequencies that are between approximately 50 and 300 GHz).

As shown in FIG. 1, the antenna module 120 can include at least one antenna tuner 130 and at least one impedance-controlling circuit 132. The antenna tuner 130 provides impedance matching between the antenna 124 and the amplification circuit 128. In particular, the antenna tuner 130 has an impedance that can be varied to maintain similar impedance matching performance across different beam-forming operations (e.g., across signals with different phases), different frequency bands (e.g., across signals with different frequencies), and/or different environmental conditions that change an impedance of the antenna 124, such as a changing distance between a portion of a user (e.g., a finger or appendage of the user) and the antenna 124.

The antenna tuner 130 can include at least one substrate tuning circuit 134 and at least one integrated circuit (IC) tuning circuit 136. The antenna tuner 130 may represents a distributed antenna tuner because portions of the antenna tuner 130 are distributed between (e.g., integrated within) separate components of the antenna module 120. In particular, the substrate tuning circuit 134 is disposed on the substrate 122, and the IC tuning circuit 136 is integrated within the radio-frequency integrated circuit 126. By implementing some of the components within the radio-frequency integrated circuit 126, the antenna tuner 130 can have a compact design that enables the antenna module 120 to satisfy size constraints of the computing device 102. This compact design also enables multiple antenna tuners 130 to be implemented within the antenna module 120 to support dynamic tuning of multiple antenna elements of an antenna array, as further described with respect to FIG. 3.

The impedance-controlling circuit 132 controls the impedance of the antenna tuner 130. In some implementations, the impedance-controlling circuit 132 can indirectly measure an impedance of the antenna 124 and/or detect a change in the impedance of the antenna 124. For example, the impedance-controlling circuit 132 can determine and monitor a magnitude of a reflection coefficient by measuring an amount of power that is reflected between the antenna 124 and the amplification circuit 128. This reflection coefficient is indicative of the impedance of the antenna 124. Additionally or alternatively, the impedance-controlling circuit 132 can measure signal strength of a received signal or a signal-to-noise ratio associated with the received signal.

The impedance-controlling circuit 132 can be implemented within the radio-frequency integrated circuit 126 between the amplification circuit 128 and the antenna tuner 130. Based on the measured or detected change in the impedance of the antenna 124, the impedance-controlling circuit 132 dynamically adjusts the impedance of the antenna tuner 130 by an appropriate amount to facilitate impedance matching.

In other implementations, the impedance-controlling circuit 132 can be coupled to a processor within the computing device 102 (e.g., the processor 108, a communication processor, a modem, etc.) and can set the impedance of the antenna tuner 130 to predetermined values based on an operational configuration of the computing device 102 as indicated by this processor. The substrate 122, the antenna 124, the radio-frequency integrated circuit 126, the antenna tuner 130, and the impedance-controlling circuit 132 may be packaged together as part of the antenna module 120, as further described with respect to FIG. 2.

Figure 2:
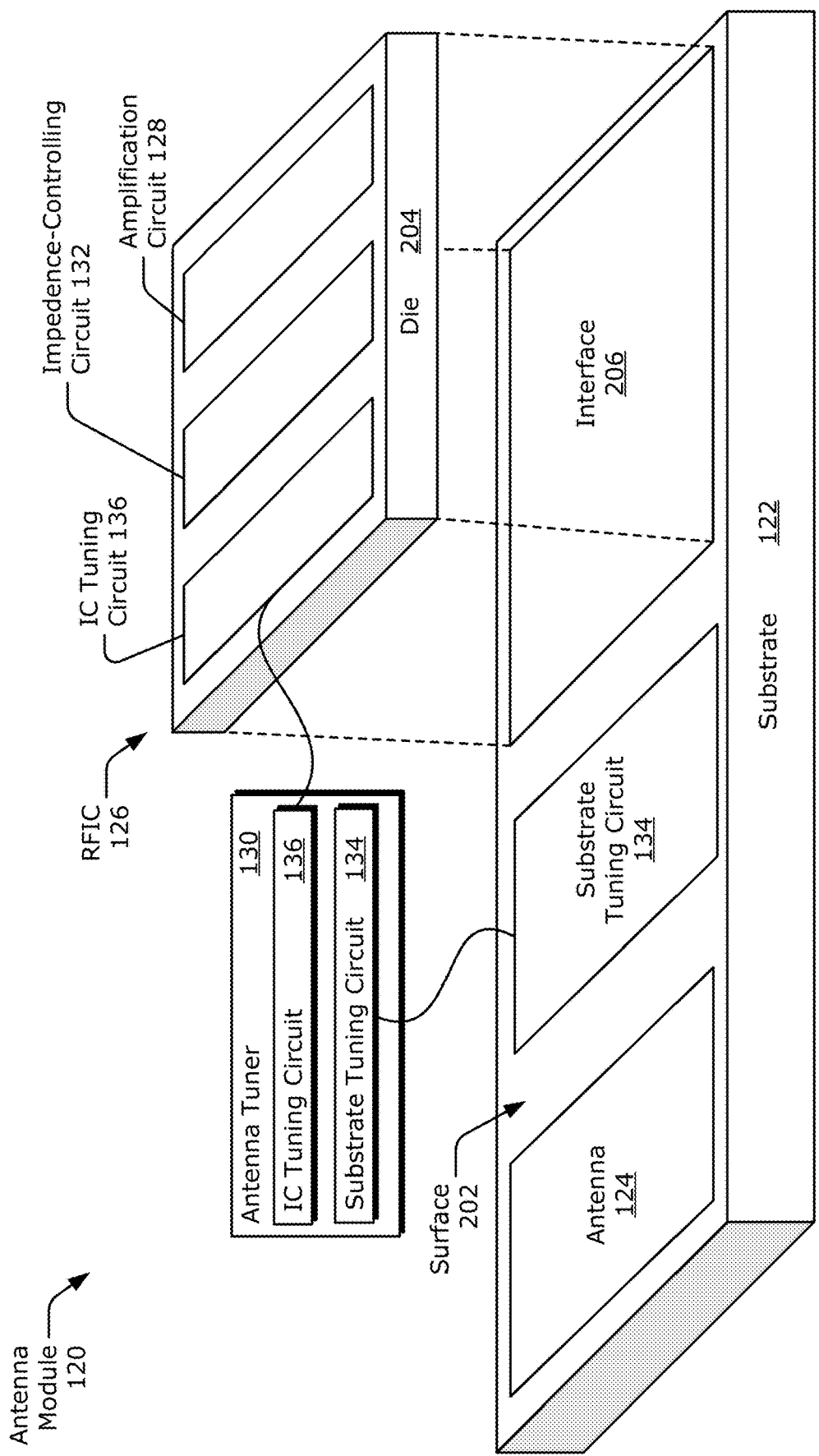
FIG. 2 illustrates an example implementation of an antenna module with an antenna tuner.

FIG. 2 illustrates an example implementation of the antenna module 120 with the antenna tuner 130. In the depicted configuration, the antenna module 120 includes the antenna 124 and the radio-frequency integrated circuit 126. In other implementations, the antenna module 120 can include more than one antenna 124 and/or more than one radio-frequency integrated circuit 126.

As shown in FIG. 2, the antenna 124, the radio-frequency integrated circuit 126, and the substrate tuning circuit 134 of the antenna tuner 130 are disposed on a surface 202 of the substrate 122. In other implementations, one or more of these entities (e.g., the antenna 124 and/or the substrate tuning circuit 134) can be disposed on another surface of the substrate 122, in/on a layer within the substrate 122, and/or dispersed between multiple layers or an internal layer and a surface of the substrate 122. For example, the radio-frequency integrated circuit 126 can instead be mounted to an underside of the substrate 122 (e.g., disposed on another surface that is opposite the surface 202 and is not visible in FIG. 2). The antenna 124 can be formed on the surface 202 and/or in a layer of the substrate 122 nearer to the surface 202 than to the surface on which the radio-frequency integrated circuit 126 is mounted. This may result in a boresight of the antenna 124 facing away from the radio-frequency integrated circuit 126, which can help mitigate undesired coupling. In other embodiments, a boresight of the antenna 124 may be approximately perpendicular to the surface 202.

The radio-frequency integrated circuit 126 is implemented on a die 204. The amplification circuit 128, the impedance-controlling circuit 132, and the IC tuning circuit 136 of the antenna tuner 130 are disposed on the die 204. The die 204 can be mounted to the surface 202 of the substrate 122 via an interface 206. The interface 206, which is disposed on the surface 202, is configured to accept and connect to the die 204. Although not explicitly depicted, the interface 206 can include terminals that connect the radio-frequency integrated circuit 126 to the substrate tuning circuit 134 or other components that are external to the antenna module 120, such as another integrated circuit or a processor.

As shown in FIG. 2, the components of the antenna tuner 130 (e.g., the substrate tuning circuit 134 and the IC tuning circuit 136) may be distributed between the substrate 122 and the radio-frequency integrated circuit 126. In particular, the substrate tuning circuit 134 is directly disposed on the substrate 122 (e.g., placed on at least one layer of the substrate 122), and the IC tuning circuit 136 is directly disposed on the die 204 of the radio-frequency integrated circuit 126. Because the IC tuning circuit 136 is implemented within the radio-frequency integrated circuit 126 (e.g., disposed on the die 204), the IC tuning circuit 136 is not directly disposed on the substrate 122. The antenna 124, the substrate tuning circuit 134, and the radio-frequency integrated circuit 126 are electrically connected together, as further described with respect to FIG. 3.

Figure 3:
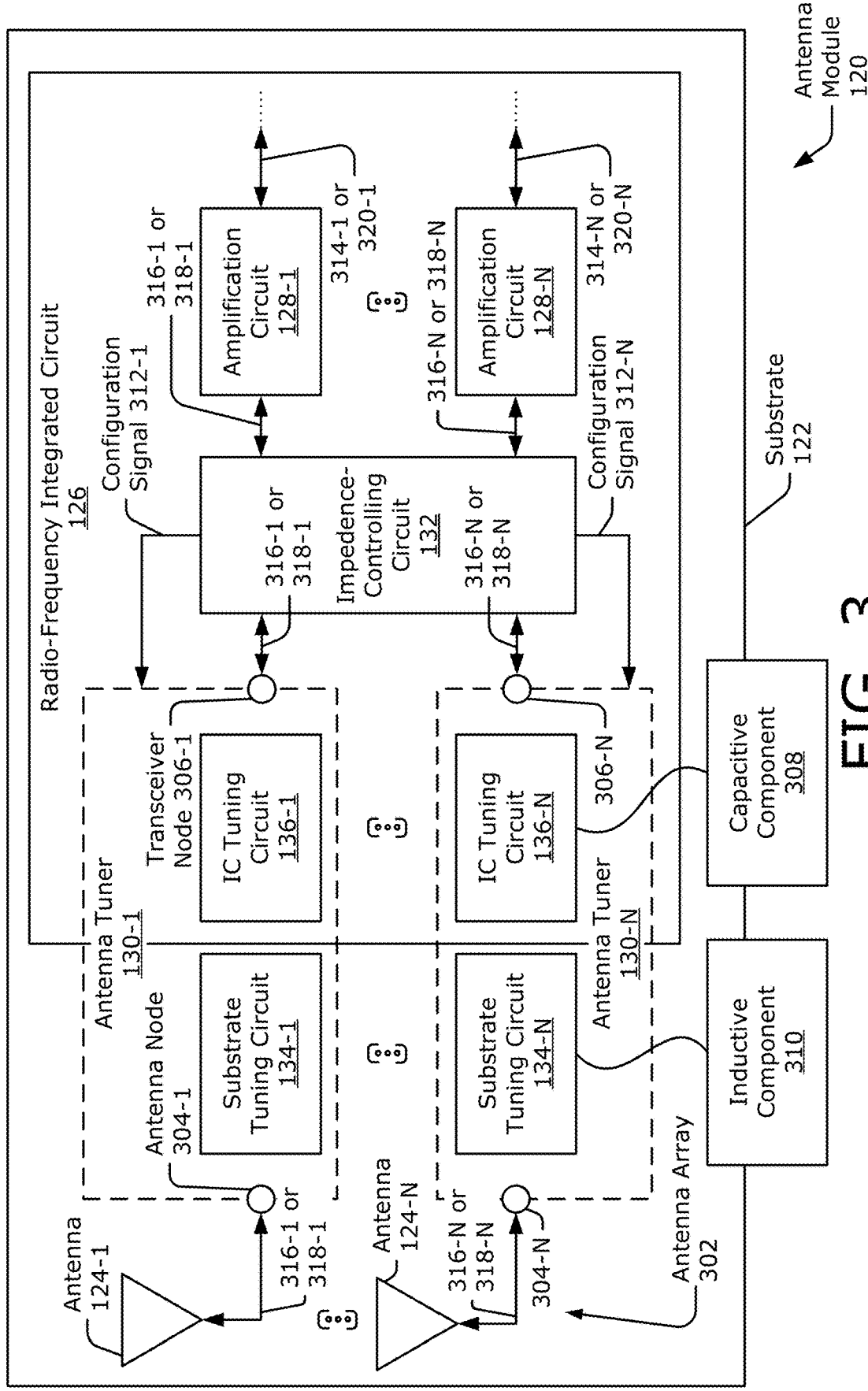
FIG. 3 illustrates an example implementation of an antenna module with multiple antennas, multiple antenna tuners, and a radio-frequency integrated circuit.

FIG. 3 illustrates an example implementation of the antenna module 120 with multiple antennas 124-1 to 124-N, multiple antenna tuners 130-1 to 130-N, and the radio-frequency integrated circuit 126. The variable N represents a positive integer. The radio-frequency integrated circuit 126 includes amplification circuits 128-1 to 128-N. Each amplification circuit 128-1 to 128-N can include one or more power amplifiers, one or more low-noise amplifiers, or some combination thereof. For example, the amplification circuit 128-1 may be configured as a transmit amplifier and may include a power amplifier and/or driver amplifier having an output coupled to the antenna 124-1, and may omit receive circuitry. In another example, the amplification circuit 128-1 may be configured as a receive amplifier and may include a low noise amplifier having an input coupled to the antenna 124-1, and may omit transmit circuitry. In yet another example, the amplification circuitry 128-1 may be configured for both transmit and receive operations, and may include a power amplifier having an output coupled to the antenna 124-1 and a low noise amplifier having an input coupled to the antenna 124-1.

In the depicted configuration, the antennas 124-1 to 124-N represent antenna elements of an antenna array 302. Each antenna 124-1 to 124-N is coupled to a respective antenna tuner 130-1 to 130-N. For example, the antenna 124-1 is coupled to the antenna tuner 130-1, and the antenna 124-N is coupled to the antenna tuner 130-N. In some such embodiments, the antennas 124-1 to 124-N have single feeds. In implementations in which the antennas 124-1 to 124-N have multiple feeds, each feed may be coupled to a separate antenna tuner 130. For example, a first feed of the antenna 124-1 is coupled to a first one of the antenna tuners 130-1 to 130-N and a second feed of the antenna 124-2 is coupled to a second one of the antenna tuners 130-1 to 130-N. In some cases, the feeds can be associated with different frequencies, phases, and/or polarizations.

Each antenna tuner 130 includes an IC tuning circuit 136 (also of FIGS. 1 and 2), a substrate tuning circuit 134 (also of FIGS. 1 and 2), an antenna node 304, and a transceiver node 306. For example, the antenna tuner 130-1 includes a substrate tuning circuit 134-1, an IC tuning circuit 136-1, an antenna node 304-1, and a transceiver node 306-1. The substrate tuning circuit 134-1 is disposed on the substrate 122, and the IC tuning circuit 136-1 is integrated within the radio-frequency integrated circuit 126. The antenna node 304-1 is coupled to the antenna 124-1, and the transceiver node 306-1 is coupled (indirectly or directly) to the amplification circuit 128-1. Similarly, the antenna tuner 130-N includes a substrate tuning circuit 134-N, an IC tuning circuit 136-N, an antenna node 304-N, and a transceiver node 306-N. The substrate tuning circuit 134-N is disposed on the substrate 122, and the IC tuning circuit 136-N is integrated within the radio-frequency integrated circuit 126. The antenna node 304-N is coupled to the antenna 124-N, and the transceiver node 306-N is coupled (indirectly or directly) to the amplification circuit 128-N. The substrate tuning circuits 134-1 to 134-N and the IC tuning circuits 136-1 to 136-N are coupled together between the antenna nodes 304-1 to 304-N and the transceiver nodes 306-1 to 306-N, respectively.

In example implementations, the IC tuning circuits 136-1 to 136-N each include at least one capacitive component 308. The substrate tuning circuits 134-1 to 134-N each include at least one inductive component 310. The capacitive component 308 has a negative reactance, and the inductive component 310 has a positive reactance. An example capacitive component 308 can include at least one varactor, at least one switched capacitor or variable capacitor, at least one capacitor, or some combination thereof. An example inductive component 310 can include at least one transmission line, at least one variable inductor, at least one inductor, or some combination thereof. At least one component of each antenna tuner 130-1 to 130-N has a tunable (e.g., variable) impedance. As such, the positive reactance of the inductive component 310 and/or the negative reactance of the capacitive component 308 can be varied by the impedance-controlling circuit 132.

In the depicted configuration, the impedance-controlling circuit 132 is coupled between the antenna tuners 130-1 to 130-N and the amplification circuits 128-1 to 128-N. For example, respective portions of the impedance-controlling circuit 132 may be electrically connected in series between each of the antenna tuners 130 and the respective amplification circuit 128. In other embodiments, one or more of the amplification circuits 128 are directly connected to the respective antenna tuner 130 (e.g., directly to the transceiver node 306). In such embodiments, the impedance-controlling circuit 132 (or portions thereof) may be coupled in a parallel or shunt path. In some embodiments, the impedance-controlling circuit 132 includes one or more couplers configured to magnetically couple a portion of a signal being communicated between an antenna tuner 130 and a respective amplification circuit 128 to circuitry configured to measure an impedance of the antenna 124 and/or a magnitude of a reflection coefficient, as described above.

Although not illustrated, the amplification circuits 128-1 to 128-N can be coupled to other components (not shown) of the radio-frequency integrated circuit 126, such as phase shifters, mixers, amplifiers, or coupling circuits (e.g., combiners or splitters). For example, one or more mixers may be implemented in the radio-frequency integrated circuit 126, and may be configured to upconvert an intermediate frequency communication signal to a mmW frequency for transmission, and/or may be configured to downconvert a mmW frequency signal to an intermediate frequency for reception. Further, at least one phase shifter may be coupled to each amplification circuit 128 and implemented in the radio-frequency integrated circuit 126. For example, a phase shifter may be coupled between the one or more mixers and a respective amplification circuit 128. In such embodiments, the antennas 124 may be configured as a phased array.

During transmission and/or reception, the impedance-controlling circuit 132 generates configuration signals 312-1 to 312-N and provides the configuration signals 312-1 to 312-N to the antenna tuners 130-1 to 130-N, respectively. The configuration signals 312-1 to 312-N specify particular configurations or target impedances of the antenna tuners 130-1 to 130-N, respectively. The antenna tuners 130-1 to 130-N accept the configuration signals 312-1 to 312-N and adjust (e.g., change) impedances of the substrate tuning circuits 134-1 to 134-N and/or impedances of the IC tuning circuits 136-1 to 136-N accordingly. In particular, the antenna tuners 130-1 to 130-N tune the reactances of the capacitive components 308 within the IC tuning circuits 136-1 to 136-N, tune the reactances of the inductive components 310 within the substrate tuning circuits 134-1 to 134-N, or some combination thereof. In this manner, the antenna tuners 130-1 to 130-N provide the specified impedances according to the impedance-controlling circuit 132.

In some implementations, the impedance-controlling circuit 132 configures the impedances of the antenna tuners 130-1 to 130-N based on an operational configuration of the computing device 102 (e.g., a beamforming configuration and/or a chosen frequency band). During transmission, the impedance-controlling circuit 132 can additionally or alternatively measure the reflection coefficient and set the impedances of the antenna tuners 130-1 to 130-N to reduce the reflection coefficient. During reception, the impedance-controlling circuit 132 can additionally or alternatively measure the signal strength associated with the radio-frequency signals 318-1 to 318-N and set the impedances of the antenna tuners 130-1 to 130-N to increase the signal-to-noise ratios (SNRs) associated with the radio-frequency signals 318-1 to 318-N. In general, the impedance-controlling circuit 132 appropriately configures the antenna tuners 130-1 to 130-N to improve impedance matching between the antennas 124-1 to 124-N and the amplification circuits 128-1 to 128-N during transmission and/or reception.

During transmission, the amplification circuits 128-1 to 128-N accept respective radio-frequency signals 314-1 to 314-N from other components within the radio-frequency integrated circuit 126 or from another integrated circuit or component, either within the module 120 or external thereto. The amplification circuits 128-1 to 128-N amplify the radio-frequency signals 314-1 to 314-N to generate amplified radio-frequency signals 316-1 to 316-N.

The antenna tuners 130-1 to 130-N provide the corresponding impedances specified by the impedance-controlling circuit 132. In some cases, the impedance-controlling circuit 132 adjusts the impedances provided by the antenna tuners 130-1 to 130-N to cause a magnitude (or absolute value) of each reflection coefficient associated with the antenna tuners 130-1 to 130-N to be less than a predetermined threshold. By providing these impedances, the antenna tuners 130-1 to 130-N substantially match output impedances of the amplification circuits 128-1 to 128-N to input impedances of the antennas 124-1 to 124-N, respectively. Additionally, the antenna tuners 130-1 to 130-N accept the amplified radio-frequency signals 316-1 to 316-N at the transceiver nodes 306-1 to 306-N and pass the amplified radio-frequency signals 316-1 to 316-N to the antennas 124-1 to 124-N via the antenna nodes 304-1 to 304-N.

In the depicted configuration, the antenna tuners 130-1 to 130-N accept the amplified radio-frequency signals 316-1 to 316-N indirectly from the amplification circuits 128-1 to 128-N via the impedance-controlling circuit 132. In other implementations (not shown) in which the impedance-controlling circuit 132 is not electrically coupled between the antenna tuners 130-1 to 130-N and the amplification circuits 128-1 to 128-N, the antenna tuners 130-1 to 130-N can accept the amplified radio-frequency signals 316-1 to 316-N "directly" from the amplification circuits 128-1 to 128-N (e.g., without propagating through the impedance-controlling circuit 132, although there may be other intervening circuitry).

The antennas 124-1 to 124-N transmit the amplified radio-frequency signals 316-1 to 316-N. The amplified radio-frequency signals 316-1 to 316-N can form, for example, an uplink signal that is transmitted by the computing device 102 to the base station 104 (of FIG. 1).

During reception, the antennas 124-1 to 124-N receive radio-frequency signals 318-1 to 318-N, which can represent portions of a downlink signal transmitted by the base station 104 and received at the computing device 102 (of FIG. 1). The antenna tuners 130-1 to 130-N provide the corresponding impedances specified by the impedance-controlling circuit 132. In some cases, the impedance-controlling circuit 132 adjusts the impedances provided by the antenna tuners 130-1 to 130-N to cause signal-to-noise ratios associated with the radio-frequency signals 318-1 to 318-N to be greater than a predetermined threshold. By providing these impedances, the antenna tuners 130-1 to 130-N substantially match output impedances of the antennas 124-1 to 124-N to input impedances of the amplification circuits 128-1 to 128-N, respectively. Additionally, the antenna tuners 130-1 to 130-N accept the radio-frequency signals 318-1 to 318-N at the antenna nodes 304-1 to 304-N and pass the radio-frequency signals 318-1 to 318-N to the amplification circuits 128-1 to 128-N via the transceiver nodes 306-1 to 306-N.

The amplification circuits 128-1 to 128-N amplify the radio-frequency signals 318-1 to 318-N to generate amplified radio-frequency signals 320-1 to 320-N. The radio-frequency integrated circuit 126 passes these amplified radio-frequency signals 320-1 to 320-N to other components within the radio-frequency integrated circuit 126 or to another integrated circuit or component, either within the antenna module 120 or external thereto. The impedance-controlling circuit 132 can dynamically adjust the impedances of the antenna tuners 130-1 to 130-N to maintain similar impedance matching performance for a variety of different types of signals (e.g., signals with different frequencies and/or phases) and for a variety of different environments, as further described with respect to FIGS. 4-1 and 4-2.

Figures 1, 4:
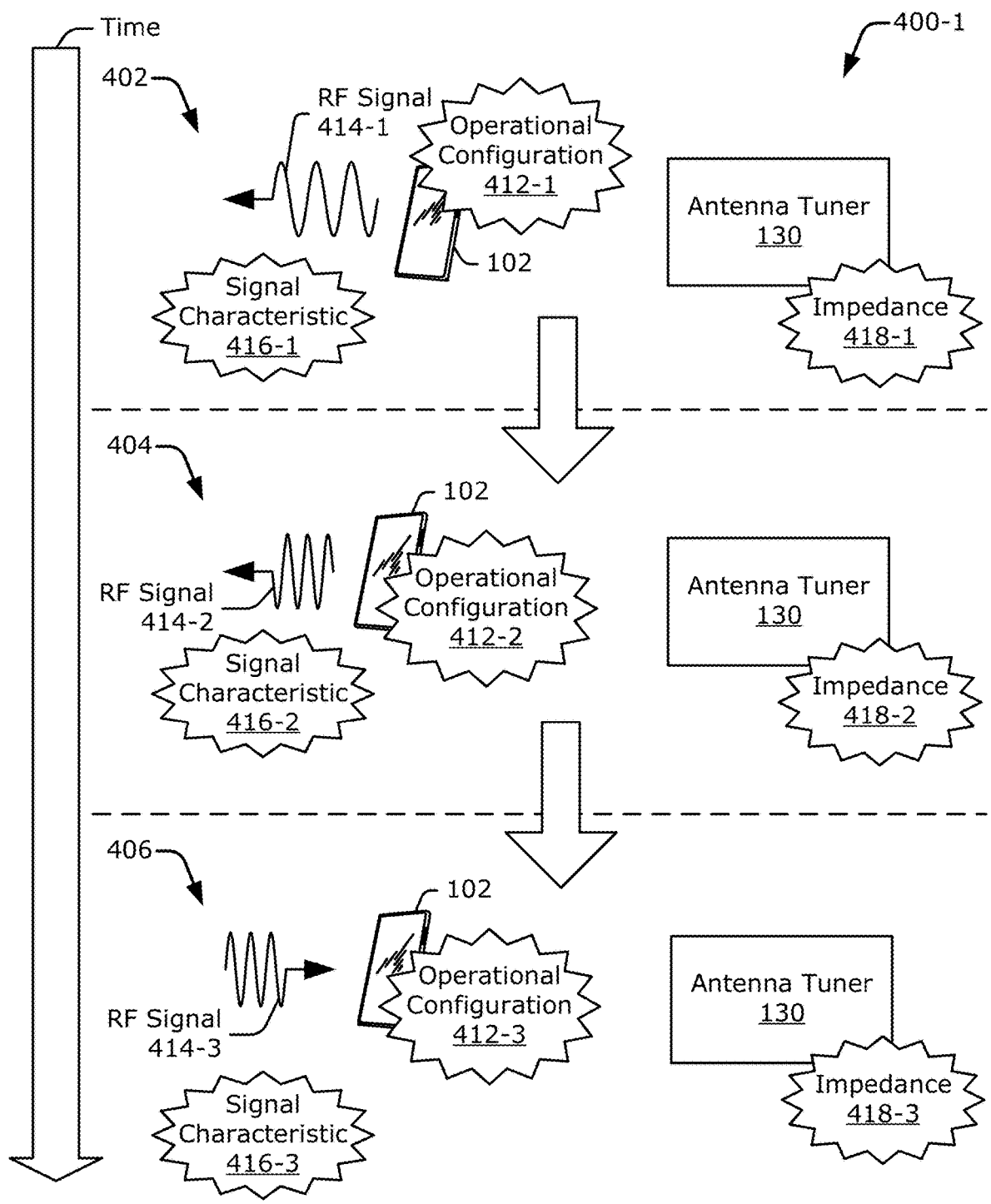
Figures 2, 4:
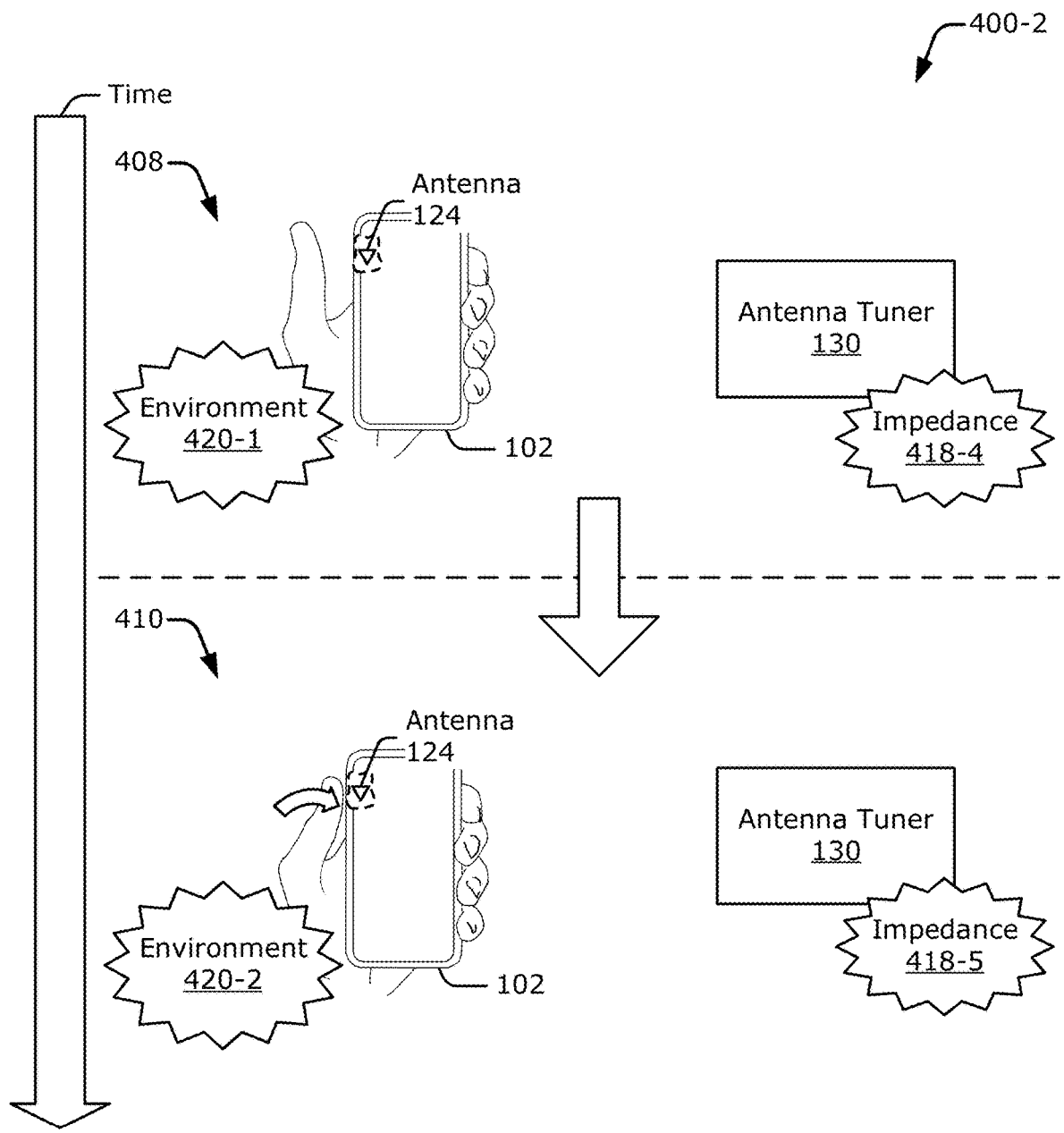

FIGS. 4-1 and 4-2 illustrate example sequence flow diagrams 400-1 and 400-2 for adjusting an impedance of the antenna tuner 130 (e.g., the antenna tuner 130-1 or 130-N of FIG. 3), with time elapsing in a downward direction. The impedance of the antenna tuner 130 is adjusted according to one or more events that cause the impedance of the antenna 124 (e.g., the antenna 124-1 or 124-N of FIG. 3) to change. These events can include a change in an operational configuration of the computing device 102, as shown at 402, 404, and 406 in FIG. 4-1 or a change in an external environment, as shown at 408 and 410 in FIG. 4-2.

At 402 in FIG. 4-1, the computing device 102 is in a first operational configuration 412-1, which transmits a first radio-frequency (RF) signal 414-1 via the antenna 124. The first radio-frequency signal 414-1 represents the amplified radio-frequency signal 316-1 or 316-N (of FIG. 3) and has a first signal characteristic 416-1, such as a particular phase and/or frequency. The phase can be based on a selected beamforming operation performed as part of the first operational configuration 412-1. This beamforming operation enables the antenna array 302 (of FIG. 3) to steer a main lobe of its radiation pattern in a particular direction. The frequency can be based on a selected frequency band associated with the first operational configuration 412-1. Due to the first signal characteristic 416-1, the antenna 124 has a particular impedance.

To improve impedance matching between the antenna 124 and the amplification circuit 128 (e.g., the amplification circuit 128-1 or 128-N of FIG. 3), the impedance-controlling circuit 132 causes the antenna tuner 130 to have a first impedance 418-1. This first impedance 418-1 is selected to reduce a magnitude of the reflection coefficient below a predetermined threshold for the first operational configuration 412-1. In this way, the antenna tuner 130 facilitates transmission of the first radio-frequency signal 414-1.

At 404 in FIG. 4-1, the operational configuration of the computing device 102 changes to a second operational configuration 412-2, which transmits a second radio-frequency signal 414-2 via the antenna 124. The second radio-frequency signal 414-2 also represents the amplified radio-frequency signal 316-1 or 316-N (of FIG. 3). The second radio-frequency signal 414-2 has a second signal characteristic 416-2 that is different from the first signal characteristic 416-1. For example, the second radio-frequency signal 414-2 can have a different phase and/or a different frequency from the first radio-frequency signal 414-1. This change can occur due to the second operational configuration 412-2 performing a different beamforming operation than the first operational configuration 412-1 (e.g., steering the main lobe of the antenna array 302 in a different direction). Additionally or alternatively, this change can occur due to the second operational configuration 412-2 using a different frequency band than the first operational configuration 412-1. Due to the second signal characteristic 416-2, the antenna 124 has a different impedance in the second operational configuration 412-2 than in the first operational configuration 412-1.

To improve impedance matching between the antenna 124 and the amplification circuit 128 for the second operational configuration 412-2, the impedance-controlling circuit 132 causes the antenna tuner 130 to have a second impedance 418-2 that is different from the first impedance 418-1. This second impedance 418-2 is selected to reduce a magnitude of the reflection coefficient below a predetermined threshold for the second operational configuration 412-2. In this way, the antenna tuner 130 facilitates transmission of the second radio-frequency signal 414-2.

At 406 in FIG. 4-1, the operational configuration of the computing device 102 changes to a third operational configuration 412-3, which receives a third radio-frequency signal 414-3 via the antenna 124. The third radio-frequency signal 414-3 represents the radio-frequency signal 318-1 or 318-N (of FIG. 3). The third radio-frequency signal 414-3 has a third signal characteristic 416-3, which can be similar or different than the first signal characteristic 416-1 or the second signal characteristic 416-2. As the antenna 124 is receiving instead of transmitting, the antenna 124 has a different impedance in the third operational configuration 412-3 than in the first operational configuration 412-1 and the second operational configuration 412-2.

To improve impedance matching between the antenna 124 and the amplification circuit 128 for the third operational configuration 412-3, the impedance-controlling circuit 132 causes the antenna tuner 130 to have a third impedance 418-3 that is different from the first impedance 418-1 and the second impedance 418-2. This third impedance 418-3 is selected to increase a signal-to-noise ratio of the radio-frequency signal 414-3 above a predetermined threshold for the third operational configuration 412-3. In this way, the antenna tuner 130 facilitates reception of the third radio-frequency signal 414-3.

At 408 in FIG. 4-2, the computing device 102 operates within a first environment 420-1 in which a user's thumb is positioned away from the antenna 124. In this example, the user's thumb does not obstruct (or minimally obstructs) the antenna 124. To improve impedance matching between the antenna 124 and the amplification circuit 128, the impedance-controlling circuit 132 can measure the reflection coefficient or signal-to-noise ratio and cause the antenna tuner 130 to have a fourth impedance 418-4 based on this measurement. In some cases, the fourth impedance 418-4 can be the first impedance 418-1 at 402, the second impedance 418-2 at 404, the third impedance 418-3 at 406, or another impedance that is different from the impedances 418-1 to 418-3. The fourth impedance 418-4 can be selected to reduce the magnitude of the reflection coefficient below a predetermined threshold for the environment 420-1 and/or increase the signal-to-noise ratio above a predetermined threshold for the environment 420-1.

At 410, the computing device 102 operates in a second environment 420-2 in which the user's thumb is positioned close to the antenna 124. In this example, the user's thumb obstructs (or at least partially obstructs) the antenna 124. To improve impedance matching between the antenna 124 and the amplification circuit 128, the impedance-controlling circuit 132 can measure the reflection coefficient or signal-to-noise ratio and cause the antenna tuner 130 to have a fifth impedance 418-5 based on this measurement. Because of the proximity of the user's thumb to the antenna 124, the measured reflection coefficient (or measured signal-to-noise ratio) at 410 can differ from the measured reflection coefficient (or measured signal-to-noise ratio) at 408. As such, the fifth impedance 418-5 of the antenna tuner 130 at 410 can be different from the fourth impedance 418-4 at 408. This fifth impedance 418-5 can be chosen by the impedance-controlling circuit 132 to reduce the magnitude of the reflection coefficient below a predetermined threshold for the environment 420-2 and/or increase the signal-to-noise ratio above a predetermined threshold for the environment 420-2.

The impedances 418-1 to 418-5 and/or settings of the substrate tuning circuit 134 and/or IC tuning circuit 136 applied to implement such impedances may be different or substantially the same, or may overlap in one or more ways. For example, a subset of settings used to effect a first one of the impedances 418-1 to 418-5 may also be used to effect a second one of the impedances 418-1 to 418-5.

At 408 and 410, the antenna 124 can be transmitting and/or receiving radio frequency signals. In some situations, the impedance-controlling circuit 132 causes the antenna tuner 130 to have a particular impedance based on both the operational configuration and the environment. An example implementation of the antenna tuner 130 is further described with respect to FIG. 5-1.

Figures 1, 5:
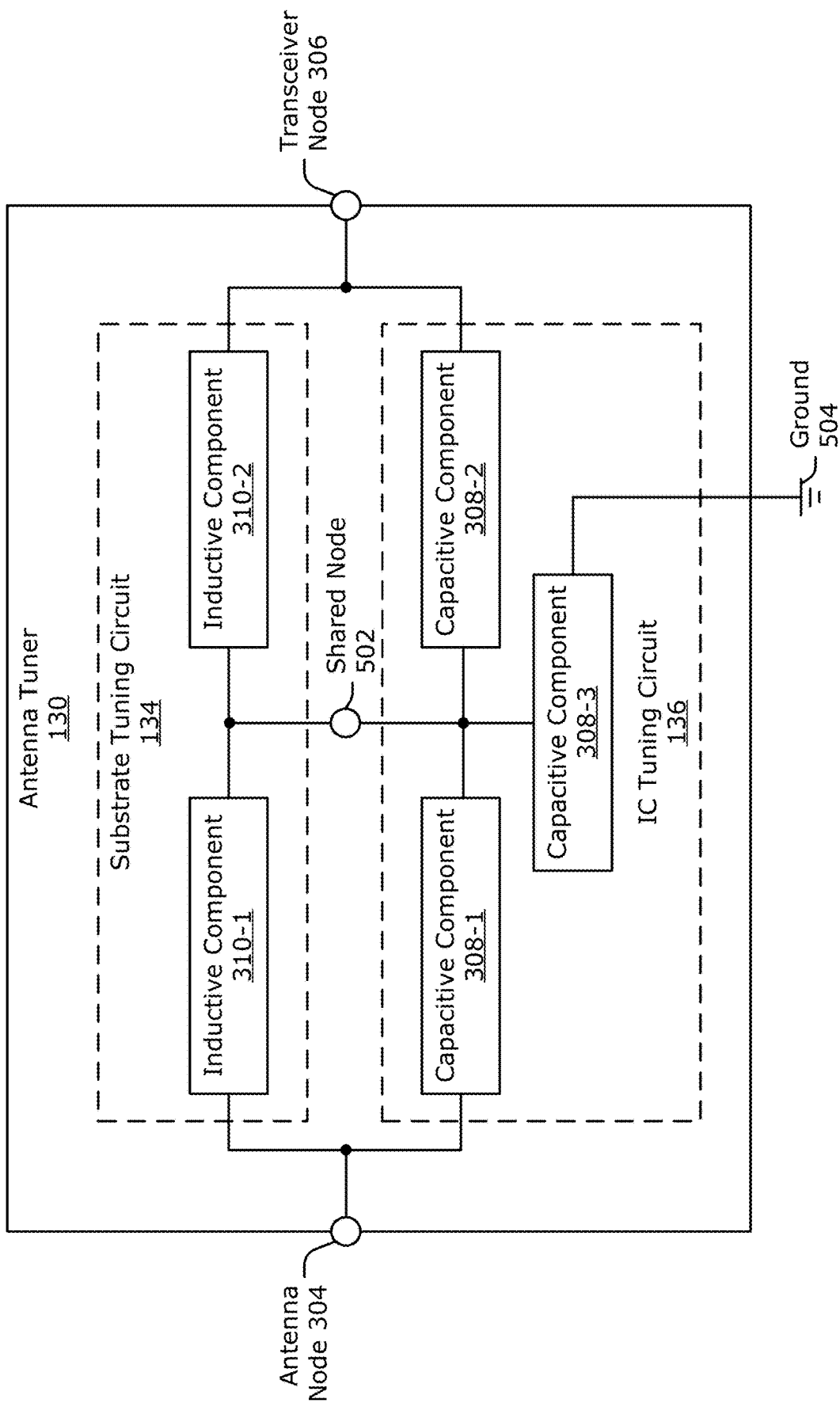
Figures 2, 5:
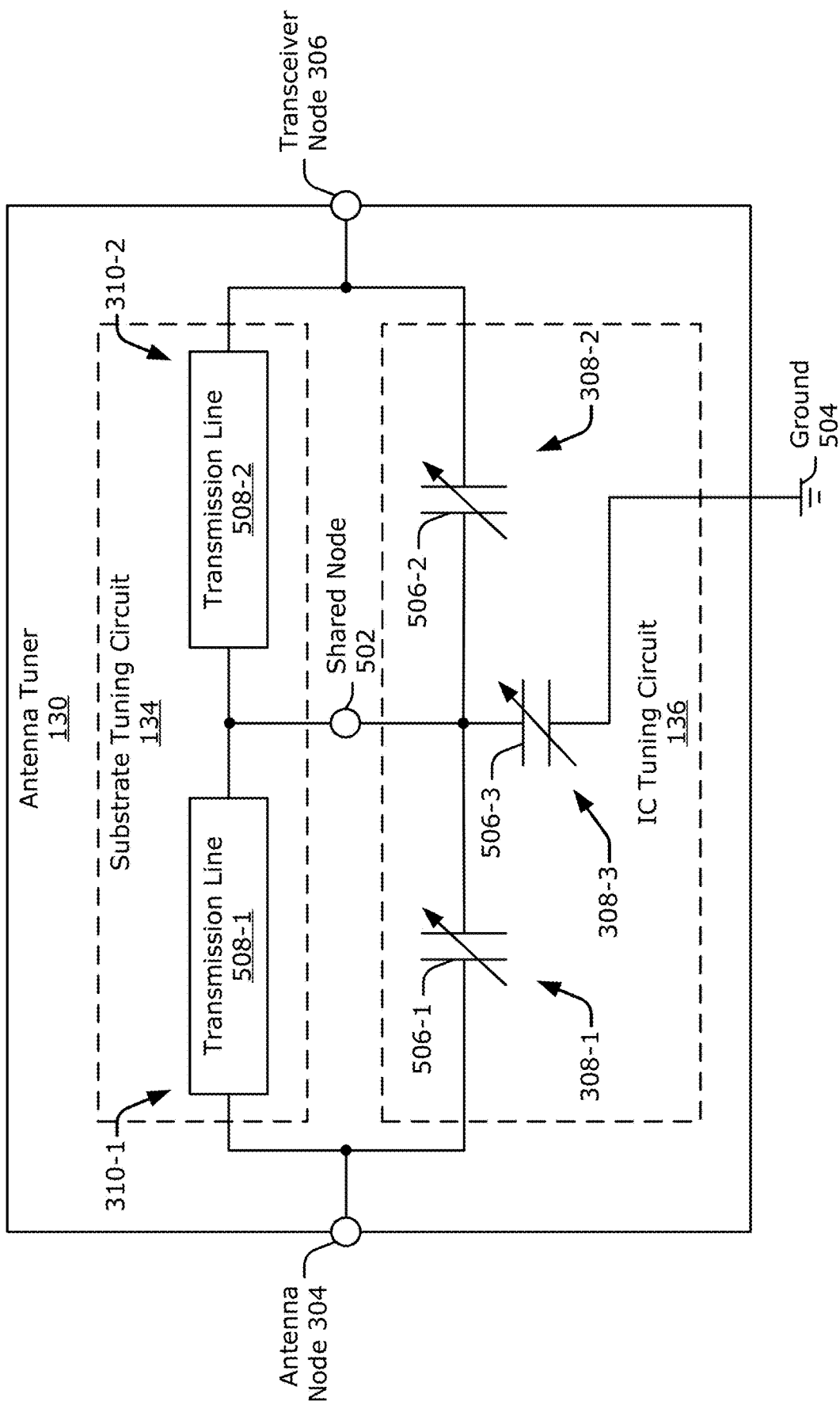
Figures 3, 5:
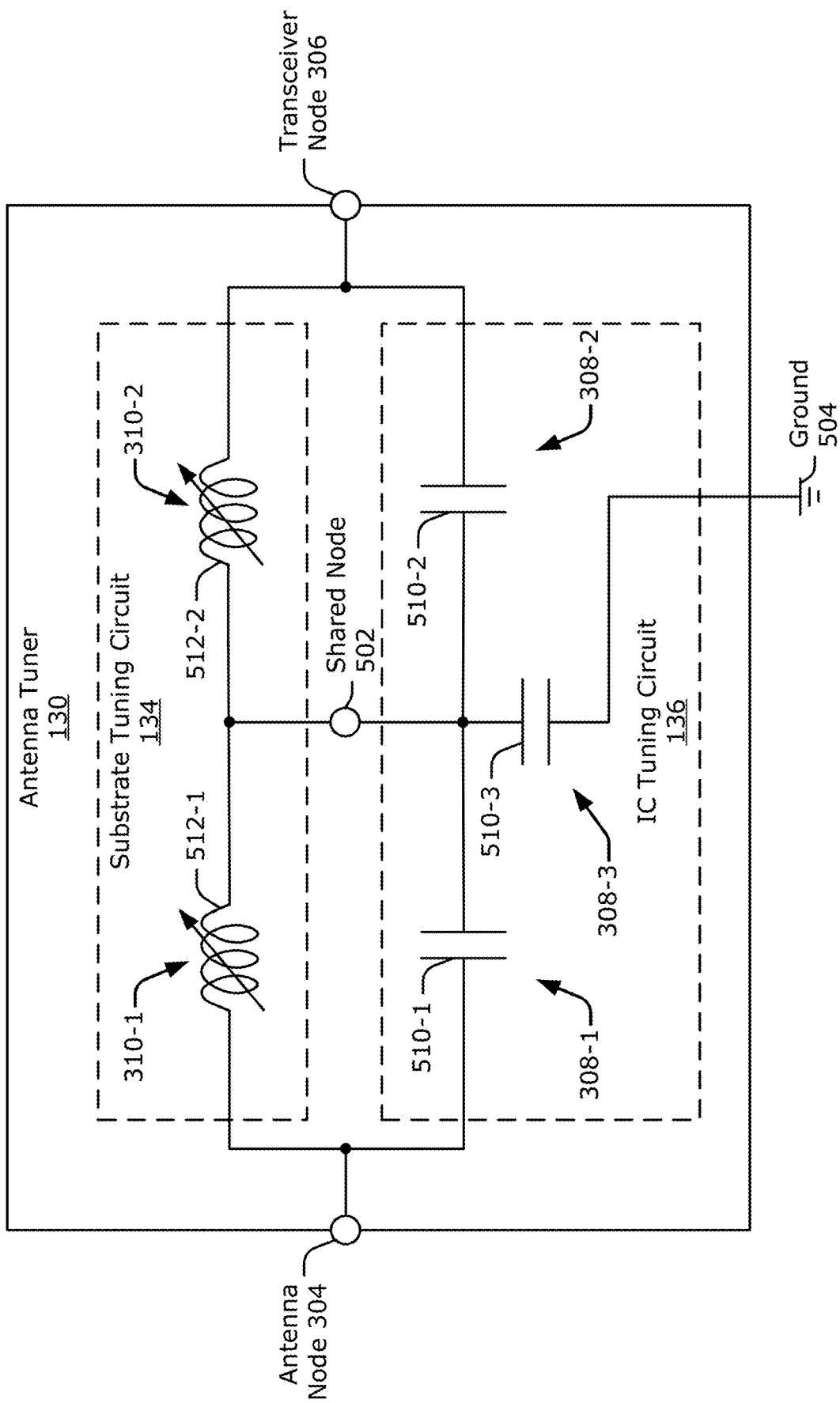

FIG. 5-1 illustrates an example implementation of the antenna tuner 130. In the depicted configuration, the antenna tuner 130, which can represent the antenna tuner 130-1 or 130-N of FIG. 3, includes the substrate tuning circuit 134 and the IC tuning circuit 136. The substrate tuning circuit 134 and the IC tuning circuit 136 are coupled to a shared node 502, the antenna node 304 (e.g., the antenna node 304-1 or 304-N of FIG. 3), and the transceiver node 306 (e.g., the transceiver node 306-1 or 306-N of FIG. 3).

In example implementations, the substrate tuning circuit 134 includes a first inductive component 310-1 and a second inductive component 310-2. Although not explicitly shown in FIG. 5-1, the first inductive component 310-1 and the second inductive component 310-2 are disposed on or in the substrate 122. The first inductive component 310-1 is coupled between the antenna node 304 and the shared node 502. The second inductive component 310-2 is coupled between the shared node 502 and the transceiver node 306.

The IC tuning circuit 136 includes a first capacitive component 308-1, a second capacitive component 308-2, and a third capacitive component 308-3. Although not explicitly shown in FIG. 5-1, the capacitive components 308-1 to 308-3 are integrated within the radio-frequency integrated circuit 126 (e.g., disposed on the die 204 of FIG. 2). The first capacitive component 308-1 is coupled between the antenna node 304 and the shared node 502. As such, the first capacitive component 308-1 and the first inductive component 310-1 are coupled together in parallel. The second capacitive component 308-2 is coupled between the shared node 502 and the transceiver node 306. As such, the second capacitive component 308-2 and the second inductive component 310-2 are coupled together in parallel. The third capacitive component 308-3 is coupled between the shared node 502 and a ground 504. The ground 504 can be a local ground of the radio-frequency integrated circuit 126 or the antenna module 120.

To conserve space within the radio-frequency integrated circuit 126, the capacitive components 308-1 to 308-3 can be designed to have smaller impedances than the inductive components 310-1 to 310-2. As such, the impedances of the inductive components 310-1 to 310-2 can contribute a larger portion of the impedance of the antenna tuner 130 while the impedances of the capacitive components 308-1 to 308-3 can contribute a smaller portion of the impedance of the antenna tuner 130. In this case, the inductive components 310-1 to 310-2 can provide a bulk of the impedance of the antenna tuner 130 while the capacitive components 308-1 to 308-3 can be used to fine-tune the impedance of the antenna tuner 130. As an example, the IC tuning circuit 136 can have an adjustable capacitance between approximately 0 to 150 femtofarads (fF). In other embodiments, one or more of the capacitive components 308-1 to 308-3 each have an adjustable capacitance between approximately 0 to 150 fF. In some embodiments, the substrate tuning circuit 134 has an impedance that is approximately (or is variable around and includes approximately) 50 Ohms at one or more operating frequencies (for example, one or more mmW frequencies). In other embodiments, one or both of the inductive components 310-1 and 310-2 each have an impedance that is approximately (or is variable around and includes approximately) 50 Ohms at one or more operating frequencies (for example, one or more mmW frequencies).

In some cases, it can be cheaper and easier to design the capacitive components 308-1 to 308-3 to have variable impedances and the inductive components 310-1 and 310-2 to have fixed impedances, as further described with respect to FIG. 5-2.

FIG. 5-2 illustrates another example implementation of the antenna tuner 130. In the depicted configuration, the capacitive components 308-1 to 308-3 are implemented using respective varactors 506-1 to 506-3. The varactors 506-1 to 506-3 have variable impedances. The inductive components 310-1 and 310-2 are implemented using respective transmission lines 508-1 and 508-2. In this case, the impedances of the transmission lines 508-1 and 508-2 are fixed. In some embodiments, a design of the transmission lines 508 may be used to compensate for constraints inherent in the varactors 506 and/or design thereof. For example, in some embodiments, a size (e.g., length) of the transmission lines 508 may be increased in order to reduce the tuning range required for the varactors 506. Disposing the transmission lines 508 on or in the substrate 122 may enable such implementations in some embodiments. Other implementations can have inductive components 310 with variable impedances, as further described with respect to FIG. 5-3.

FIG. 5-3 illustrates an additional example implementation of the antenna tuner 130. In the depicted configuration, the capacitive components 308-1 to 308-3 are implemented using capacitors 510-1 to 510-3. The capacitors 510-1 to 510-3 can have fixed or variable impedances. The inductive components 310-1 and 310-2 are implemented using respective tunable inductors 512-1 and 512-2. The tunable inductors 512-1 and 512-2 have variable impedances.

In general, implementations of the antenna tuner 130 can provide impedance tuning using the capacitive components 308-1 to 308-3 of the IC tuning circuit 136, the inductive components 310-1 to 310-2 of the substrate tuning circuit 134, or both. In some embodiments, additional space and/or flexibility of design is available when implementing one or more of the inductive components 310 on or in the substrate 122.

Although the substrate tuning circuit 134 of FIGS. 5-1, 5-2, and 5-3 are shown to include two inductive components 310-1 and 310-2, it is to be understood that the substrate tuning circuit 134 can include any quantity of inductive components 310, including one inductive component or more than two inductive components. Likewise, the IC tuning circuit 136 of FIGS. 5-1, 5-2, and 5-3 can include any quantity of capacitive components 308, including one capacitive component, two capacitive components, or more than three capacitive components. In some embodiments, more than two inductive components 310 are implemented, a capacitive component 308 is implemented in parallel with each of the inductive components 310, and respective other capacitive components are coupled between each node coupling pairs of capacitive and inductive components together and ground. In general, implementations of the substrate tuning circuit 134 and/or the IC tuning circuit 136 with larger quantity of components can enable a wider impedance range and finer control over the impedance 418 (of FIG. 4-1 or FIG. 4-2) of the antenna tuner 130.

The inductive components 310 and capacitive components 308 of the antenna tuner 130 can be arranged in any type of network between the antenna node 304, the transceiver node 306, and the ground 504. Example networks include a series network, a parallel network, a T-network, a t-network, a A-network, a Y-network, or some combination thereof. In general, an architecture of the antenna tuner 130 is designed to enable the antenna tuner 130 to have a particular impedance tuning range and resolution to provide impedance matching for various operational configurations 412 of the computing device 102 and/or various environments 420 in which the computing device 102 may operate.

Those of skill in the art will appreciate that configurations other than those illustrated in FIGS. 1 to 5-3 may be implemented pursuant to the concepts described herein. For example, in some embodiments the antenna(s) 124 are omitted from the antenna module 120. In such embodiments, the antennas 124 may be implemented in a separate module or on a substrate separate from the substrate 122, and coupled to the antenna node(s) 304. In some embodiments, the amplification circuit 128 is implemented in an IC different from the IC in which the IC tuning circuit 136 is implemented. Thus, the radio-frequency integrated circuit 126 may be split into several ICs, which may be disposed in the same module or in different modules. In some embodiments, the antenna module 120 is coupled to another module including an IC which includes a mixer configured to convert between an intermediate frequency and mmW frequency and/or which includes a phase shifter that is coupled to the amplification circuit 128 through an interconnect. In some embodiments, the substrate tuning circuit 134 and the IC turning circuit 136 are not contained within a module, but are implemented on a substrate such as a flexible printed circuit which couples frequency conversion and/or phase shift circuitry to a substrate or board on which the antenna 124 is implemented.

FIG. 6 is a flow diagram illustrating an example process 600 for operating the antenna tuner 130. The process 600 is described in the form of a set of blocks 602-606 that specify operations that can be performed. However, operations are not necessarily limited to the order shown in FIG. 6 or described herein, for the operations may be implemented in alternative orders or in fully or partially overlapping manners. Also, more, fewer, and/or different operations may be implemented to perform the process 600, or an alternative process. Operations represented by the illustrated blocks of the process 600 may be performed by a computing device 102 (e.g., of FIG. 1) or an antenna module 120 (e.g., of FIG. 1, 2, or 3). More specifically, the operations of the process 600 may be performed, in part, by an antenna tuner 130 as shown in FIG. 1 to 5-3.

At block 602, an impedance is provided between an amplification circuit of a radio-frequency integrated circuit and an antenna. The antenna and the radio-frequency integrated circuit may be disposed on (or in, for example with respect to the antenna) a substrate. The impedance is provided by an antenna tuner and is based on a positive reactance of an inductive component of the antenna tuner and a negative reactance of a capacitive component of the antenna tuner. The inductive component may be disposed on or in the substrate and the capacitive component implemented within the radio-frequency integrated circuit.

For example, the antenna tuner 130 provides an impedance (e.g., one of the impedances 418-1, 418-2, 418-4, or 418-5 of FIGS. 4-1 and 4-2) between the amplification circuit 128 of the radio-frequency integrated circuit 126 and the antenna 124. The antenna 124 and the radio-frequency integrated circuit 126 are disposed on (or in, for example with respect to the antenna 124) the substrate 122, as shown in FIG. 2. The impedance of the antenna tuner 130 is based on a positive reactance of one or more inductive components 310 of the antenna tuner 130, which are disposed on or in the substrate 122. Additionally, the impedance is based on a negative reactance of one or more capacitive components 308 of the antenna tuner 130, which are implemented within the radio-frequency integrated circuit 126 (e.g., disposed on the die 204 of FIG. 2). In some situations, the impedance enables a magnitude of a reflection coefficient between the antenna 124 and the amplification circuit 128 to be less than or equal to a predetermined threshold. In this way, the antenna tuner provides impedance matching between the antenna 124 and the amplification circuit 128.

At block 604, a radio-frequency signal is passed from the amplification circuit to the antenna via the antenna tuner having the impedance. For example, the antenna tuner 130 passes an amplified radio-frequency signal (e.g., the amplified radio-frequency signal 316-1 or 316-N of FIG. 3) from the amplification circuit 128 (e.g., the amplification circuit 128-1 or 128-N of FIG. 3) to the antenna 124 (e.g., the antenna 124-1 or 124-N of FIG. 3).

At block 606, the radio-frequency signal is transmitted via the antenna. For example, the antenna 124 transmits the radio-frequency signal, such as the radio-frequency signal 414-1 or 414-2 of FIG. 4-1. Although described with respect to transmission, similar operations can be performed for reception, as further described with respect to FIG. 7.

FIG. 7 is another flow diagram illustrating an example process 700 for operating the antenna tuner 130. The process 700 is described in the form of a set of blocks 702-706 that specify operations that can be performed. However, operations are not necessarily limited to the order shown in FIG. 7 or described herein, for the operations may be implemented in alternative orders or in fully or partially overlapping manners. Also, more, fewer, and/or different operations may be implemented to perform the process 700, or an alternative process. Operations represented by the illustrated blocks of the process 700 may be performed by a computing device 102 (e.g., of FIG. 1) or an antenna module 120 (e.g., of FIG. 1, 2, or 3). More specifically, the operations of the process 700 may be performed, in part, by an antenna tuner 130 as shown in FIGS. 1 to 5-3.

At block 702, a radio-frequency signal is received via an antenna disposed on or in a substrate. For example, the antenna 124 receives the radio-frequency signal 414-3 of FIG. 4-1. The antenna 124 can be disposed on or in the substrate 122, as shown in FIG. 2.

At block 704, an impedance is provided between an amplification circuit of a radio-frequency integrated circuit and the antenna. The radio-frequency integrated circuit may be disposed on the substrate. The impedance is provided by an antenna tuner and is based on a positive reactance of an inductive component of the antenna tuner and a negative reactance of a capacitive component of the antenna tuner. The inductive component may be disposed on or in the substrate and the capacitive component implemented within the radio-frequency integrated circuit.

For example, the antenna tuner 130 provides an impedance (e.g., one of the impedances 418-3 to 418-5 of FIGS. 4-1 and 4-2) between the amplification circuit 128 of the radio-frequency integrated circuit 126 and the antenna 124. The radio-frequency integrated circuit 126 is disposed on the substrate 122, as shown in FIG. 2. The impedance of the antenna tuner 130 is based on a positive reactance of one or more inductive components 310 of the antenna tuner 130, which are disposed on or in the substrate 122. Additionally, the impedance is based on a negative reactance of one or more capacitive components 308 of the antenna tuner 130, which are implemented within the radio-frequency integrated circuit 126 (e.g., disposed on the die 204 of FIG. 2). In some situations, the impedance enables a signal-to-noise ratio of the received radio-frequency signal 414-3 to be greater than or equal to a predetermined threshold. In this way, the antenna tuner provides impedance matching between the antenna 124 and the amplification circuit 128.

At block 706, a radio-frequency signal is passed from the antenna to the amplification circuit via the antenna tuner having the impedance. For example, the antenna tuner 130 passes the radio-frequency signal 414-3 (e.g., the radio-frequency signal 318-1 or 318-N of FIG. 3) from the antenna 124 (e.g., the antenna 124-1 or 124-N of FIG. 3) to the amplification circuit 128 (e.g., the amplification circuit 128-1 or 128-N of FIG. 3.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

Some aspects describing certain configurations pursuant to the concepts described herein are included below.

Aspect 1: An apparatus comprising:
  a substrate;
  an antenna disposed on or in the substrate;
  a radio-frequency integrated circuit disposed on the substrate, the radio-frequency integrated circuit comprising an amplification circuit; and
  an antenna tuner coupled between the antenna and the amplification circuit, the antenna tuner comprising:
    an inductive component disposed on the substrate; and
    a capacitive component implemented within the radio-frequency integrated circuit.

Aspect 2: The apparatus of aspect 1, wherein:
  the inductive component is configured to provide a positive reactance; and
  the capacitive component is configured to provide a negative reactance.

Aspect 3: The apparatus of aspect 1 or 2, wherein the capacitive component is connected in parallel with the inductive component.

Aspect 4: The apparatus of any preceding aspect, wherein the capacitive component comprises a varactor.

Aspect 5: The apparatus of aspect 4, wherein the antenna tuner is configured to change a negative reactance of the varactor.

Aspect 6: The apparatus of any preceding aspect, wherein the inductive component comprises a transmission line.

Aspect 7: The apparatus of any preceding aspect, wherein the antenna tuner is configured to selectively:
  match an output impedance of the amplification circuit to an input impedance of the antenna; and
  match an output impedance of the antenna to an input impedance of the amplification circuit.

Aspect 8: The apparatus of any preceding aspect, wherein:
  the antenna is configured to:
    transmit a first radio-frequency signal with a first signal characteristic; and
    transmit a second radio-frequency signal with a second signal characteristic that is different from the first signal characteristic; and
  the antenna tuner is configured to:
    provide a first impedance based on the antenna transmitting the first radio-frequency signal, the first impedance based on a positive reactance of the inductive component and a negative reactance of the capacitive component;
    change, prior to the second radio-frequency signal being transmitted, at least one of:
      the positive reactance of the inductive component; or
      the negative reactance of the capacitive component; and
    provide a second impedance based on the antenna transmitting the second radio-frequency signal, the second impedance different from the first impedance.

Aspect 9: The apparatus of aspect 8, wherein:
  the first signal characteristic comprises a first phase; and
  the second signal characteristic comprises a second phase that is different from the first phase.

Aspect 10: The apparatus of aspect 8, wherein:
  the first signal characteristic comprises a first frequency; and
  the second signal characteristic comprises a second frequency that is different from the first frequency.

Aspect 11: The apparatus of aspect 8, wherein the first radio-frequency signal and the second radio-frequency signal each comprise at least one frequency that is greater than or equal to twenty-four gigahertz.

Aspect 12: The apparatus of any preceding aspect, wherein:
  the inductive component comprises a first inductive component;
  the capacitive component comprises a first capacitive component; and
  the antenna tuner comprises:
    a second inductive component disposed on or in the substrate;
    a second capacitive component implemented within the radio-frequency integrated circuit; and
    a third capacitive component implemented within the radio-frequency integrated circuit.

Aspect 13: The apparatus of aspect 12, wherein:
  the antenna tuner comprises:
    an antenna node coupled to the antenna;
    a shared node; and
    a transceiver node coupled to the amplification circuit;
  the first inductive component is coupled between the antenna node and the shared node;
  the second inductive component is coupled between the shared node and the transceiver node;
  the first capacitive component is coupled between the antenna node and the shared node;
  the second capacitive component is coupled between the shared node and the transceiver node; and
  the third capacitive component is coupled between the shared node and a ground.

Aspect 14: The apparatus of any preceding aspect, wherein:
  the antenna comprises a first antenna;
  the amplification circuit comprises a first amplification circuit;
  the antenna tuner comprises a first antenna tuner;
  the radio-frequency integrated circuit comprises a second amplification circuit; and
  the apparatus comprises:
    an antenna array comprising:
      the first antenna; and
      a second antenna disposed on or in the substrate; and a second antenna tuner coupled between the second antenna and the second amplification circuit, the second antenna tuner comprising:
  an inductive component disposed on or in the substrate; and
  a capacitive component implemented within the radio-frequency integrated circuit.

Aspect 15: The apparatus of aspect 14, further comprising:
  a mixer implemented within the radio-frequency integrated circuit;
  a first phase shifter implemented within the radio-frequency integrated circuit, the first phase shifter coupled between the mixer and the first amplification circuit; and
  a second phase shifter implemented within the radio-frequency integrated circuit, the second phase shifter coupled between the mixer and the second amplification circuit.

Aspect 16: The apparatus of any preceding aspect, wherein the amplification circuit comprises at least one of:
  a power amplifier configured to amplify radio-frequency signals for transmission; or
  a low-noise amplifier configured to amplify other radio-frequency signals for reception.

Aspect 17: The apparatus of any preceding aspect, further comprising:
  an antenna module,
  wherein the substrate, the antenna, the radio-frequency integrated circuit, and the antenna tuner are packaged together as part of the antenna module.

Aspect 18: The apparatus of aspect 17, further comprising:
  a display screen; and
  a processor operatively coupled to the display screen and the antenna module, the processor configured to present one or more graphical images on the display screen based on radio-frequency signals communicated by the antenna module.

Aspect 19: An apparatus comprising:
  a substrate;
  antenna means for transmitting and receiving radio-frequency signals, the antenna means disposed on or in the substrate;
  an integrated circuit comprising means for conditioning the radio-frequency signals, the integrated circuit disposed on the substrate; and
  tuning means for providing impedance matching between the antenna means and the means for conditioning, the tuning means comprising:
    inductive means for providing a positive reactance, the inductive means disposed on or in the substrate; and
    capacitive means for providing a negative reactance, the capacitive means implemented as part of the integrated circuit.

Aspect 20: The apparatus of aspect 19, wherein the capacitive means is coupled in parallel with the inductive means.

Aspect 21: The apparatus of aspect 19 or 20, wherein the capacitive means is further configured to selectively provide a first negative reactance and a second negative reactance.

Aspect 22: The apparatus of any one of aspects 19 to 21, wherein the inductive means is further configured to selectively provide a first positive reactance and a second positive reactance.

Aspect 23: The apparatus of any one of aspects 19 to 22, wherein:
  the antenna means is configured to:
    transmit a first radio-frequency signal of the radio-frequency signals with a first signal characteristic; and
    transmit a second radio-frequency signal of the radio-frequency signals with a second signal characteristic that is different from the first signal characteristic; and
  the tuning means is configured to:
    provide a first impedance based on the antenna means transmitting the first radio-frequency signal, the first impedance based on the positive reactance of the inductive means and the negative reactance of the capacitive means;
    change, prior to the second radio-frequency signal being transmitted, at least one of:
      the positive reactance of the inductive means; or
      the negative reactance of the capacitive means; and
    provide a second impedance based on the antenna means transmitting the second radio-frequency signal, the second impedance being different from the first impedance.

Aspect 24: A method for operating an antenna tuner, the method comprising:
  providing, via the antenna tuner, an impedance between an amplification circuit of a radio-frequency integrated circuit and an antenna disposed on or in a substrate, the impedance based on a positive reactance of an inductive component of the antenna tuner and a negative reactance of a capacitive component of the antenna tuner, the inductive component disposed on or in the substrate, the capacitive component implemented within the radio-frequency integrated circuit, the radio-frequency integrated circuit disposed on the substrate;
  passing, via the antenna tuner having the impedance, a radio-frequency signal from the amplification circuit to the antenna; and
  transmitting, via the antenna, the radio-frequency signal.

Aspect 25: The method of aspect 24, wherein:
  the impedance comprises a first impedance;
  the radio-frequency signal comprises a first radio-frequency signal; and
  the method comprises:
    changing at least one of the positive reactance of the inductive component or the negative reactance of the capacitive component;
    responsive to the changing, providing, via the antenna tuner, a second impedance between the amplification circuit and the antenna, the second impedance different from the first impedance;
    passing, via the antenna tuner having the second impedance, a second radio-frequency signal from the amplification circuit to the antenna; and
    transmitting, via the antenna, the second radio-frequency signal.

Aspect 26: The method of aspect 25, wherein:
  the providing of the first impedance comprises matching an output impedance of the amplification circuit to a first input impedance of the antenna; and
  the providing of the second impedance comprises matching the output impedance of the amplification circuit to a second input impedance of the antenna, the second input impedance of the antenna being different from the first input impedance.

Aspect 27: The method of aspect 25 or 26, wherein the second radio-frequency signal has a different phase than the first radio-frequency signal.

Aspect 28: The method of any one of aspects 25 to 27, wherein the second radio-frequency signal has a different frequency than the first radio-frequency signal.

Aspect 29: The method of any one of aspects 24 to 28, wherein the capacitive component is connected in parallel with the inductive component.

Aspect 30: The method of any one of aspects 24 to 29, wherein:
the capacitive component comprises a varactor; and
the inductive component comprises a transmission line.

What is claimed is:

1. An apparatus comprising:
a substrate;
an antenna array disposed on or in the substrate, the antenna array comprising at least two antennas;
a radio-frequency integrated circuit disposed on the substrate, the radio-frequency integrated circuit comprising at least two amplification circuits; and
at least two antenna tuners respectively coupled between the at least two antennas and the at least two amplification circuits, each antenna tuner of the at least two antenna tuners comprising:
an inductive component disposed on or in the substrate, the inductive component being separate from the radio-frequency integrated circuit; and
a capacitive component implemented within the radio-frequency integrated circuit.

2. The apparatus of claim 1, wherein:
the inductive component is configured to provide a positive reactance; and
the capacitive component is configured to provide a negative reactance.

3. The apparatus of claim 1, wherein the capacitive component is connected in parallel with the inductive component.

4. The apparatus of claim 1, wherein the capacitive component comprises a varactor.

5. The apparatus of claim 4, wherein each antenna tuner of the at least two antenna tuners is configured to change a negative reactance of the varactor.

6. The apparatus of claim 4, wherein the inductive component comprises a transmission line.

7. The apparatus of claim 1, wherein each antenna tuner of the at least two antenna tuners is configured to selectively:
match an output impedance of a corresponding amplification circuit of the at least two amplification circuits to an input impedance of a corresponding antenna of the at least two antennas; and
match an output impedance of the corresponding antenna to an input impedance of the corresponding amplification circuit.

8. The apparatus of claim 1, wherein:
each antenna of the at least two antennas is configured to:
transmit a first radio-frequency signal with a first signal characteristic; and
transmit a second radio-frequency signal with a second signal characteristic that is different from the first signal characteristic; and
each antenna tuner of the at least two antenna tuners is configured to:
provide a first impedance based on a corresponding antenna of the at least two antennas transmitting the first radio-frequency signal, the first impedance based on a positive reactance of the inductive component and a negative reactance of the capacitive component;
change, prior to the second radio-frequency signal being transmitted, at least one of:
the positive reactance of the inductive component; or
the negative reactance of the capacitive component; and
provide a second impedance based on the corresponding antenna transmitting the second radio-frequency signal, the second impedance different from the first impedance.

9. The apparatus of claim 8, wherein:
the first signal characteristic comprises a first phase; and
the second signal characteristic comprises a second phase that is different from the first phase.

10. The apparatus of claim 8, wherein:
the first signal characteristic comprises a first frequency; and
the second signal characteristic comprises a second frequency that is different from the first frequency.

11. The apparatus of claim 8, wherein the first radio-frequency signal and the second radio-frequency signal each comprise at least one frequency that is greater than or equal to twenty-four gigahertz.

12. The apparatus of claim 1, wherein:
the inductive component comprises a first inductive component;
the capacitive component comprises a first capacitive component; and
each antenna tuner of the at least two antenna tuners comprises:
a second inductive component disposed on or in the substrate, the second inductive component being separate from the radio-frequency integrated circuit;
a second capacitive component implemented within the radio-frequency integrated circuit; and
a third capacitive component implemented within the radio-frequency integrated circuit.

13. The apparatus of claim 12, wherein:
each antenna tuner of the at least two antenna tuners comprises:
an antenna node coupled to a corresponding antenna of the at least two antennas;
a shared node; and
a transceiver node coupled to a corresponding amplification circuit of the at least two amplification circuits;
the first inductive component is coupled between the antenna node and the shared node;
the second inductive component is coupled between the shared node and the transceiver node;
the first capacitive component is coupled between the antenna node and the shared node;
the second capacitive component is coupled between the shared node and the transceiver node; and
the third capacitive component is coupled between the shared node and a ground.

14. The apparatus of claim 1, further comprising:
a mixer implemented within the radio-frequency integrated circuit;
a first phase shifter implemented within the radio-frequency integrated circuit, the first phase shifter coupled between the mixer and a first amplification circuit of the at least two amplification circuits; and
a second phase shifter implemented within the radio-frequency integrated circuit, the second phase shifter coupled between the mixer and a second amplification circuit of the at least two amplification circuits.

15. The apparatus of claim 1, wherein each amplification circuit of the at least two amplification circuits comprises at least one of:
- a power amplifier configured to amplify radio-frequency signals for transmission; or
- a low-noise amplifier configured to amplify other radio-frequency signals for reception.

16. The apparatus of claim 1, further comprising:
an antenna module,
wherein the substrate, the at least two antennas, the radio-frequency integrated circuit, and the at least two antenna tuners are packaged together as part of the antenna module.

17. The apparatus of claim 16, further comprising:
a display screen; and
a processor operatively coupled to the display screen and the antenna module, the processor configured to present one or more graphical images on the display screen based on radio-frequency signals communicated by the antenna module.

18. The apparatus of claim 17, wherein the apparatus comprises a mobile device.

19. An apparatus comprising:
a substrate;
first antenna means for transmitting and receiving radio-frequency signals, the first antenna means disposed on or in the substrate;
second antenna means for transmitting and receiving other radio-frequency signals, the second antenna means disposed on or in the substrate;
an integrated circuit disposed on the substrate and including:
  first means for amplifying radio-frequency signals; and
  second means for amplifying other radio-frequency signals;
first antenna-tuning means for providing impedance matching between the first antenna means and the first means for amplifying;
second antenna-tuning means for providing impedance matching between the second antenna means and the second means for amplifying,
wherein the first and second antenna-tuning means each comprise:
  inductive means for providing a positive reactance, the inductive means disposed on or in the substrate, the inductive means being separate from the integrated circuit; and
  capacitive means for providing a negative reactance, the capacitive means implemented as part of the integrated circuit.

20. The apparatus of claim 19, wherein the capacitive means is coupled in parallel with the inductive means.

21. The apparatus of claim 19, wherein the capacitive means is further configured to selectively provide a first negative reactance and a second negative reactance.

22. The apparatus of claim 19, wherein the inductive means is further configured to selectively provide a first positive reactance and a second positive reactance.

23. The apparatus of claim 19, wherein:
the first and second antenna means are each configured to:
  transmit a first radio-frequency signal of the radio-frequency signals with a first signal characteristic; and
  transmit a second radio-frequency signal of the radio-frequency signals with a second signal characteristic that is different from the first signal characteristic; and
the first and second antenna-tuning means are each configured to:
  provide a first impedance based on a corresponding antenna means transmitting the first radio-frequency signal, the first impedance based on the positive reactance of the inductive means and the negative reactance of the capacitive means;
  change, prior to the second radio-frequency signal being transmitted, at least one of:
    the positive reactance of the inductive means; or
    the negative reactance of the capacitive means; and
  provide a second impedance based on the corresponding antenna means transmitting the second radio-frequency signal, the second impedance being different from the first impedance.

24. A method for operating a first antenna tuner and a second antenna tuner, the method comprising:
providing, via the first antenna tuner, a first impedance between a first amplification circuit of a radio-frequency integrated circuit and a first antenna disposed on or in a substrate, the first impedance based on a positive reactance of a first inductive component of the first antenna tuner and a negative reactance of a first capacitive component of the first antenna tuner, the first inductive component disposed on or in the substrate, the first inductive component being separate from the radio-frequency integrated circuit, the first capacitive component implemented within the radio-frequency integrated circuit, the radio-frequency integrated circuit disposed on the substrate;
passing, via the first antenna tuner having the first impedance, a first radio-frequency signal from the first amplification circuit to the first antenna;
transmitting, via the first antenna, the first radio-frequency signal;
providing, via the second antenna tuner, a second impedance between a second amplification circuit of the radio-frequency integrated circuit and a second antenna disposed on or in the substrate, the second impedance based on a positive reactance of a second inductive component of the second antenna tuner and a negative reactance of a second capacitive component of the second antenna tuner, the second inductive component disposed on or in the substrate, the second inductive component being separate from the radio-frequency integrated circuit, the second capacitive component implemented within the radio-frequency integrated circuit;
passing, via the second antenna tuner having the second impedance, a second radio-frequency signal from the second amplification circuit to the second antenna; and
transmitting, via the second antenna, the second radio-frequency signal.

25. The method of claim 24, further comprising:
changing at least one of the positive reactance of the first inductive component or the negative reactance of the first capacitive component;
responsive to the changing, providing, via the first antenna tuner, a third impedance between the first amplification circuit and the first antenna, the third impedance being different from the first impedance;
passing, via the first antenna tuner having the third impedance, a third radio-frequency signal from the first amplification circuit to the first antenna; and
transmitting, via the first antenna, the third radio-frequency signal.

26. The method of claim 25, wherein:
the providing of the first impedance comprises matching an output impedance of the first amplification circuit to a first input impedance of the first antenna; and
the providing of the third impedance comprises matching the output impedance of the first amplification circuit to a second input impedance of the first antenna, the second input impedance of the first antenna being different from the first input impedance.

27. The method of claim 25, wherein the third radio-frequency signal has a different phase than the first radio-frequency signal.

28. The method of claim 25, wherein the third radio-frequency signal has a different frequency than the first radio-frequency signal.

29. The method of claim 24, wherein the capacitive component is connected in parallel with the inductive component.

30. The method of claim 24, wherein:
the capacitive component comprises a varactor; and
the inductive component comprises a transmission line.

* * * * *